(12) United States Patent
Campbell et al.

(10) Patent No.: US 7,745,898 B2
(45) Date of Patent: Jun. 29, 2010

(54) MULTICHIP PACKAGE, METHODS OF MANUFACTURE THEREOF AND ARTICLES COMPRISING THE SAME

(75) Inventors: Levi A. Campbell, Poughkeepsie, NY (US); Casimer M. DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 11/960,903

(22) Filed: Dec. 20, 2007

(65) Prior Publication Data

US 2009/0161709 A1 Jun. 25, 2009

(51) Int. Cl.
*H01L 23/10* (2006.01)
*H01L 23/24* (2006.01)

(52) U.S. Cl. .................. 257/433; 257/707; 257/706

(58) Field of Classification Search ................ 257/706, 257/707, 432, 433; 438/122; 439/620.2, 439/620.25
See application file for complete search history.

(56) References Cited

U.S. PATENT DOCUMENTS

| | | | | |
|---|---|---|---|---|
| 4,225,213 | A * | 9/1980 | McBride et al. | 385/89 |
| 4,410,469 | A * | 10/1983 | Katagiri et al. | 264/1.25 |
| 5,105,429 | A | 4/1992 | Mundinger et al. | |
| 5,495,490 | A | 2/1996 | Rice et al. | |
| 5,708,743 | A * | 1/1998 | DeAndrea et al. | 385/88 |
| 6,072,814 | A | 6/2000 | Ryan et al. | |
| 6,713,866 | B2 | 3/2004 | Simon et al. | |
| 6,898,222 | B2 | 5/2005 | Hennig et al. | |
| 7,084,496 | B2 * | 8/2006 | Benner et al. | 257/730 |
| 7,099,533 | B1 | 8/2006 | Chenard | |
| 7,128,472 | B2 | 10/2006 | Benner et al. | |
| 7,231,961 | B2 * | 6/2007 | Alex et al. | 165/80.4 |
| 7,348,604 | B2 * | 3/2008 | Matheson | 257/98 |
| 2004/0021217 | A1 * | 2/2004 | Epitaux et al. | 257/700 |
| 2004/0252953 | A1 | 12/2004 | Crane et al. | |
| 2006/0045413 | A1 | 3/2006 | Weigert | |
| 2008/0185733 | A1 * | 8/2008 | Furuyama et al. | 257/777 |
| 2009/0028575 | A1 * | 1/2009 | Epitaux et al. | 398/139 |

FOREIGN PATENT DOCUMENTS

EP 0227114 A2 7/1987

OTHER PUBLICATIONS

Giorgio Via. "Liekki, Bookham to Showcase Compatible Optical Engine, Pump Block Unit". Posted in "Components" on Wednesday, Jan. 17, 2007. 3 pages.

* cited by examiner

*Primary Examiner*—Sheila V Clark
(74) *Attorney, Agent, or Firm*—Cantor Colburn LLP; Geraldine Monteleone

(57) ABSTRACT

Disclosed herein is a multichip package comprising an optoelectronics assembly; a socket that houses the optoelectronics assembly; the socket being in electrical communication with the optoelectronics assembly; a plate having a first surface and a second surface; the first surface being opposedly disposed to the second surface; a portion of the first surface contacting a portion of the socket to provide thermal contact between the socket and the plate; a serpentine channel being disposed between the plate and the socket to provide a passage for a communication cable that is in operative communication with the optoelectronics assembly; and a heat exchanger in thermal contact with the plate; the heat exchanger being operative to cool the multichip package.

18 Claims, 8 Drawing Sheets

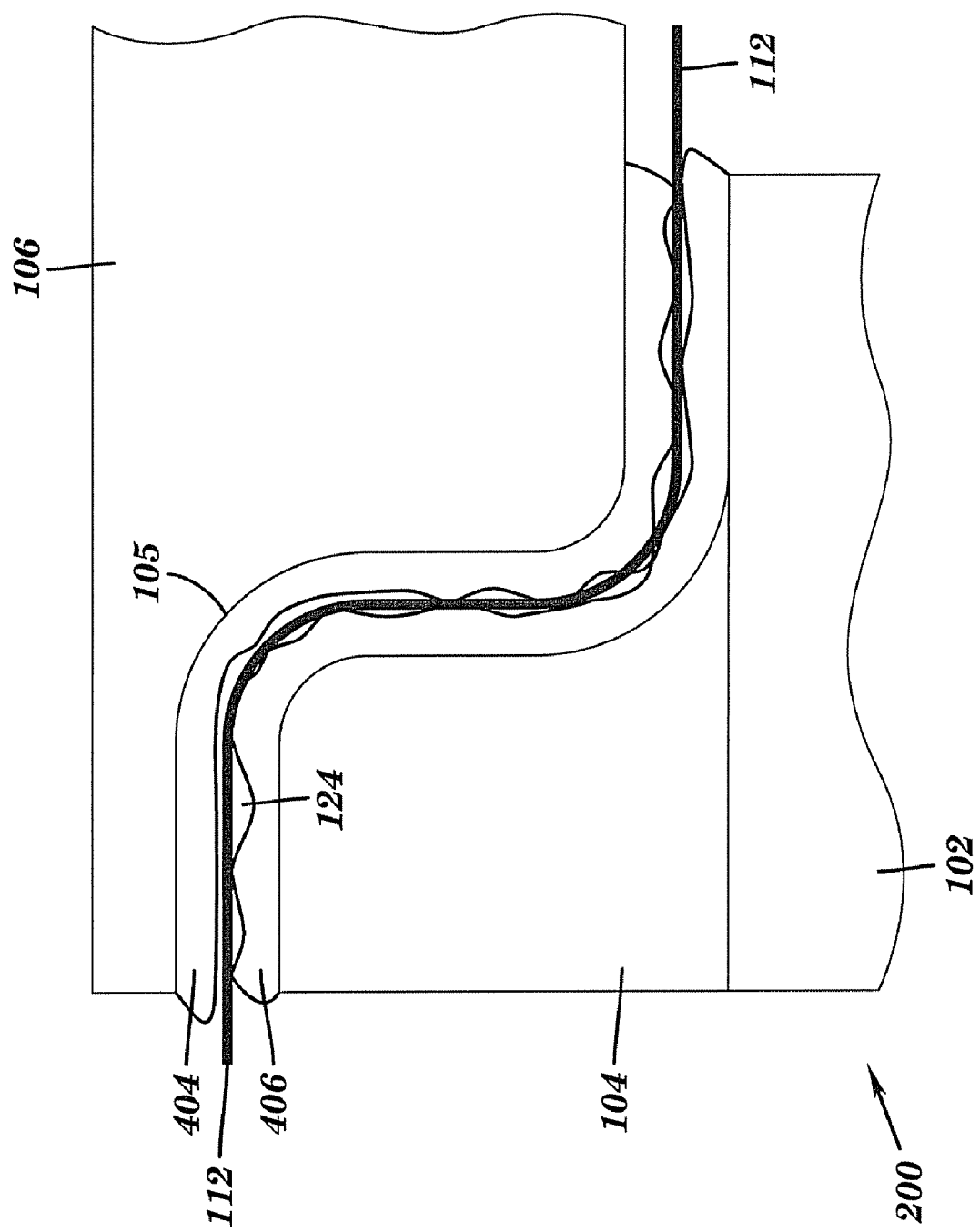

MULTICHIP PACKAGE, METHODS OF MANUFACTURE THEREOF AND ARTICLES COMPRISING THE SAME

BACKGROUND

This disclosure relates to a multichip package, methods of manufacture thereof and articles comprising the same.

Multichip packages often contain chips, integrated circuits and similar components. They often include optical transceivers enabled to communicate with devices that lie outside of the multichip package. Laser diodes, used in these optical transceivers are small and compact, they are efficient at converting electrical energy into laser energy, and they are reliable. However, when a laser diode is operated at a high average power, it generates a substantial amount of heat in a small volume, thereby raising the temperature of the multichip package, which causes negative effects such as a wavelength shift and a loss of efficiency and reliability. If the temperature gets high enough, destruction of the multichip package may result. Multichip packages having semiconductor laser diodes are therefore often placed in communication with heat exchangers in a separate package from other electronic components.

For example, in order to achieve maximum efficiency, it is desirable for a multichip package that employs chips, integrated circuits and/or optoelectronics to operate at a temperature that is below 60° C. For reliable, long-lived operation, operating temperatures of less than 85° C. facilitate operation of the multichip package without a substantial loss of efficiency. Temperatures even moderately above 85° C. will substantially affect efficiency and reliability, substantially shortening the useful life of the multichip package. Furthermore, at these higher temperatures the output laser light will be shifted in wavelength. High temperatures encourage the growth and propagation of defects in semiconductor lasers, which decrease their efficiency (light output produced for a given amount of input electrical current). A larger current may be applied to compensate for the decreased efficiency, which then produces even more heat, encouraging the growth of even more defects and a greater loss of efficiency. If such multichip packages are maintained at or near their optimum temperature, then the chips and/or diodes disposed thereon will perform at maximum efficiency for a large lifetime, and emit a consistent wavelength.

It is therefore desirable to have a multichip package that can be cooled sufficiently to produce a high average power. It is also desirable for the cooling system to be designed so that fiber optic cables communicating with the laser diodes will not be damaged. In addition, it is desirable for the multichip package and the cooling system to be designed so that a high flow rate of coolant can be achieved.

SUMMARY

Disclosed herein is a multichip package comprising an optoelectronics assembly; a socket that houses the optoelectronics assembly; the socket being in electrical communication with the optoelectronics assembly; a plate having a first surface and a second surface; the first surface being opposedly disposed to the second surface; a portion of the first surface contacting a portion of the socket to provide thermal contact between the socket and the plate; a serpentine channel being disposed between the plate and the socket to provide a passage for a communication cable that is in operative communication with the optoelectronics assembly; and a heat exchanger in thermal contact with the plate; the heat exchanger being operative to cool the multichip package.

Disclosed herein is a method comprising disposing an optoelectronics assembly in a socket; the socket comprising a base plate, a wall, and an insert; disposing a plate on the socket; the disposing being effective to create a channel between the plate and the insert; disposing a communication cable in the channel; the communication cable contacting the optoelectronics assembly; and disposing a heat exchanger on a surface of the plate; the surface of the plate that contacts the heat exchanger being opposed to the surface that faces the optoelectronic assembly.

BRIEF DESCRIPTION OF FIGURES

FIG. 4 is an exemplary view of one manner of sealing the channel; the channel is sealed by an elastomeric flap;

DETAILED DESCRIPTION

The use of the terms "a" and "an" and "the" and similar references in the context of describing the invention (especially in the context of the following claims) are to be construed to cover both the singular and the plural, unless otherwise indicated herein or clearly contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

Disclosed herein is a multichip package that comprises a plate disposed upon a socket and having one or more substrates disposed therebetween; the plate and/or the substrate being configured for mounting an optoelectronic assembly. The optoelectronic assembly may comprise one or more of a data processing chip, a data switching chip, a data storage chip, an electronic chip set that is configured for providing multiplexing, demultiplexing, coding or decoding, an optoelectronic element comprising laser diodes or photodetectors for driving and/or receiving functions, or the like, or a combination comprising at least one of the foregoing chips, chip sets or optoelectronic elements. In one embodiment, a surface of the plate is in communication with the socket along an entire surface of a sidewall of the socket except for channels in which fiber optic cables that communicate with the optoelectronic assembly are disposed. An opposing surface of the plate (from the surface in communication with the socket) is in communication with a heat exchanger that rapidly transfers heat away from the multichip package.

In one embodiment, the channels are advantageously shaped to minimize the transfer of mechanical forces from outside the plate and socket assembly to the optoelectronic assembly. In another embodiment, the channels can be sealed with a suitable sealant to prevent moisture from contacting the optoelectronic assembly. In yet another embodiment, a single channel or a plurality of channels can be disposed on a single side or a plurality of sides of the multichip package to facilitate communications between the multichip package and a device that is located external to the multichip package. In another embodiment, the optoelectronics are integrated within the multichip package in such a manner that both the optoelectronics and the other electronic components within the package share a common cooling system (i.e. are attached to a common heat exchanger and are cooled using a common cooling fluid). In yet another embodiment, the common heat exchanger is a heat sink.

Figure 1:
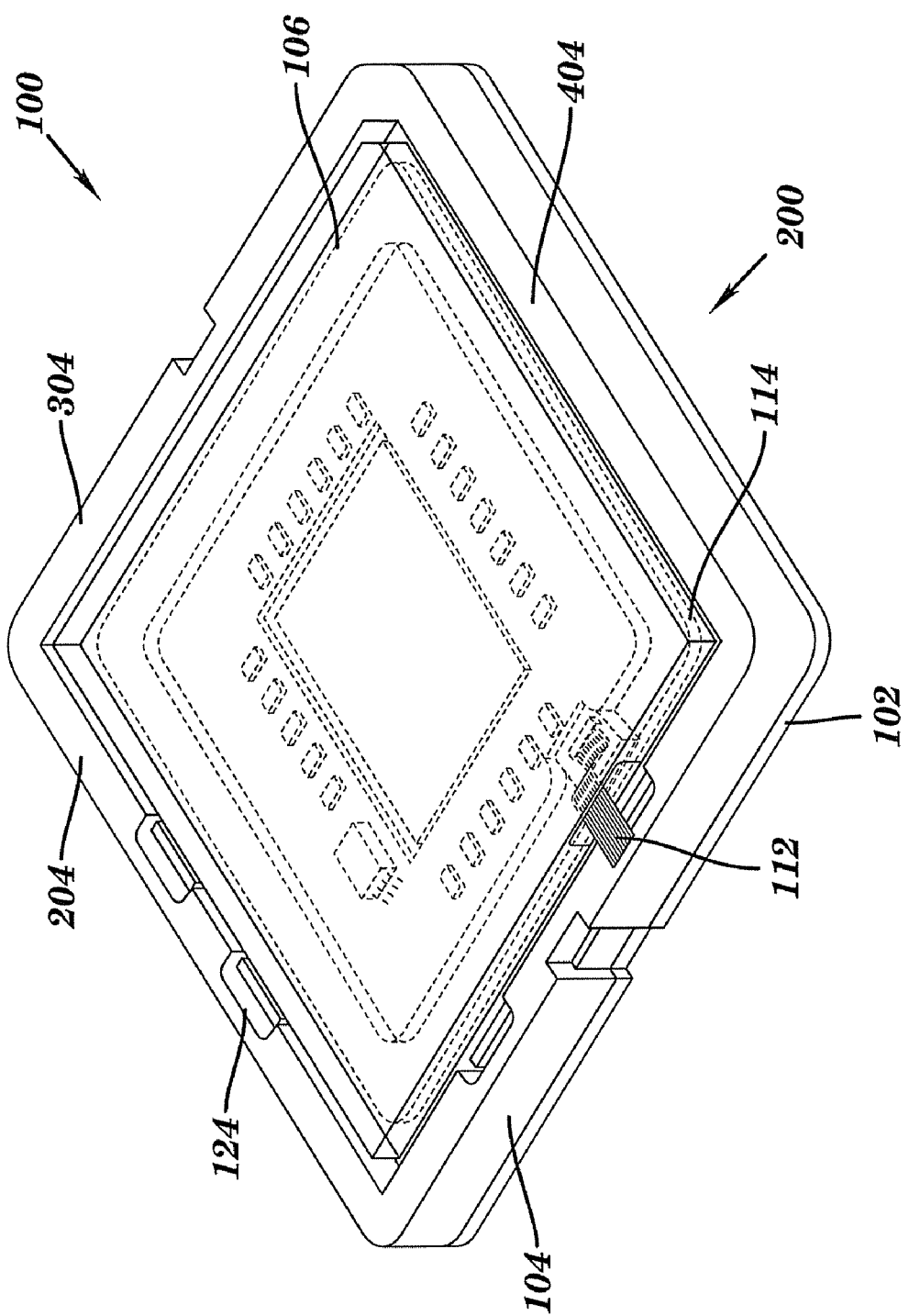
FIG. 1 is a perspective view of the multichip package.
Figure 2:
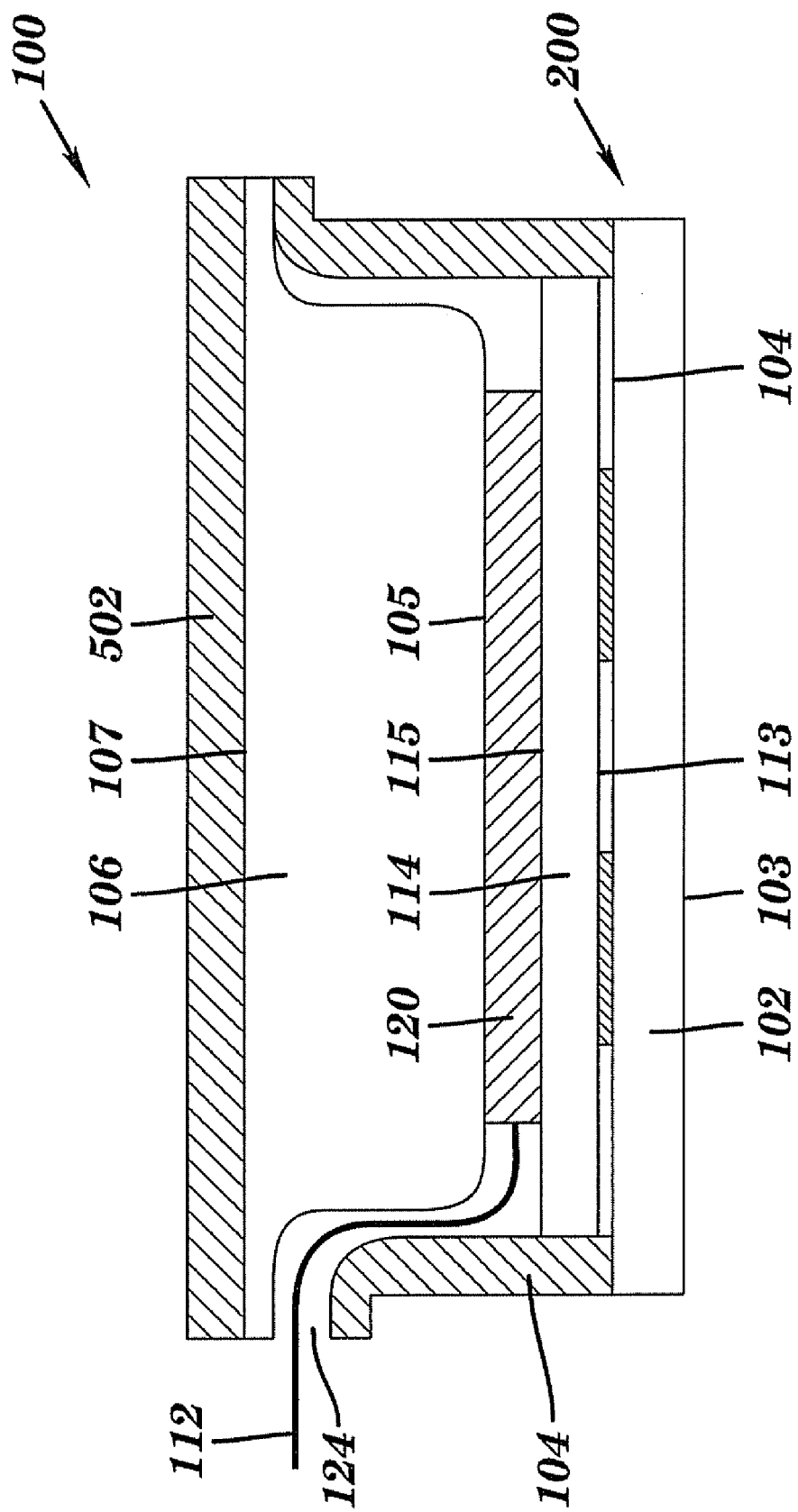
FIG. 2 is an exemplary cross-sectional view of a multichip package.

With reference now to the FIGS. 1 and 2, an exemplary depiction of the multichip package 100 comprises a socket 200 that comprises a base plate 102 and a plurality of sidewalls 104, 204, 304 and 404 respectively. FIG. 1 is a perspective view of the multichip package, while the FIG. 2 is a cross-sectional view of a multichip package. It is to be noted that FIG. 2 is not a sectional view of the multichip package of FIG. 1. FIG. 2 is a simplified exemplary view of a multichip package that embodies some of the inventive elements of this disclosure.

The sidewalls are named the first sidewall 104, the second sidewall 204, the third sidewall 304 and the fourth sidewall 404 respectively. The base plate 102 comprises a first surface 101 and a second surface 103. The second surface 103 has the plurality of sidewalls 104, 204, 304 and 404 disposed upon it. The plate 106 also comprises a first surface 105 and a second surface 107. As will be detailed below, the multichip package 100 is cooled by a single heat exchanger 502 disposed upon the second surface 107 of the plate 106 by way of thermal conduction through the plate 106. In an exemplary embodiment, the heat exchanger 502 is a heat sink. A thermal grease (not shown) is disposed between the second surface 107 of the plate 106 and the single heat sink 502. The thermal grease improves thermal conductivity between the plate 106 and the single heat sink 502.

With reference now to FIG. 2, which depicts an exemplary embodiment of the multichip package, the first sidewall 104 protrudes vertically from the base plate 102.

As shown in the FIG. 2, in one exemplary embodiment, the base plate 102 has disposed upon it a single first substrate 114. The first surface 113 of the first substrate 114 is in electrical and mechanical communication with the base plate 102, while the second surface 115 of the first substrate 114, which is opposed to the first surface, is in communication with the plate 106 via the optoelectronic assembly 120 and via other microprocessors, memory chips, or the like. The base plate 102 may be in electrical communication with the first surface 113 of the first substrate 114. In one embodiment, the electrical communication between the base plate 102 and the first substrate 114 can provide electricity for the functioning of the optoelectronic assembly 120 as well as electrical signal communication among the optoelectronics, microprocessors, memory chips, or the like, resident within the multichip module (MCM) as well as signal communication and power supplied by the server to the MCM. As noted above, the multiple components present in the MCM are all cooled by a single heat sink by way of thermal conduction through the plate 106.

The optoelectronic assembly 120 is disposed on the second surface 115 of the first substrate 114. As shown in the FIG. 1, it is desirable to dispose the optoelectronic assembly 120 on the first substrate 114, as close as possible to the side walls. In one embodiment, the optoelectronics assembly 120 is disposed proximate to the side walls 104, 204, 304 and 404 within a distance that is less than or equal to about 10% of the largest total distance between two opposing side walls of the multichip package.

It is desirable for the optoelectronic assembly 120 to comprise an array of vertical cavity surface emitting lasers (VCSELS) and semiconductor laser diodes that are located proximate to the edge of the multichip package 100. Disposing the optoelectronic assembly 120 proximate to the edge of the multichip package 100 and close to the side walls 104, 204, 304 and 404 respectively, facilitates an easy discharge of thermal energy generated by the optoelectronic assembly 120. In one embodiment, the optoelectronic assembly 120 along with a small amount of associated electronics are located near the edge of the multichip package. This permits the use of other commercially available, comparative heat exchangers that are generally used for cooling other commercially available, comparative multichip packages. As will be detailed later, the disposal of the optoelectronic assembly 120 proximate to the side walls also permits easy connectability between a communication cable 112 and the optoelectronic assembly 120. The design of the multichip package to effect cooling without a redesign of the heat exchanger reduces costs associated with the design and the manufacturing of the multichip package 100 while at the same time providing for more efficient heat transfer and cooling of the multichip package 100.

The plate 106 comprises a first surface 105 and a second surface 107 that are opposedly disposed to one another. As can be seen in the FIG. 1, the first surface 105 of the plate 106 contacts the socket 200 on an upper surface of the side walls 104, 204, 304 and 404 respectively, except at those locations containing a channel 124 through which a communication cable 112 passes. The multichip package 100 can thus comprise a plurality of channels for facilitating the passage of a plurality of communication cables that provide optical and/or electrical communication between the optoelectronic assembly 120 and other optical or electrical devices located external to the multichip package 100.

In one embodiment, the communication cable 112 is an optical fiber ribbon cable comprising a plurality of optical fibers. As shown in the FIGS. 1 and 2, the optical fiber ribbon cables are disposed in a channel 124 formed between the opposing surfaces of the socket 200 and the plate 106. As can be seen in the FIG. 2, the channel 124 is created only at those locations in the socket 200 where it is desired to let the communication cable 112 exit the multichip package to communicate with an external device that is located outside the multichip package. The plate 106 is in intimate contact with the sidewalls 104, 204, 304 and 404 at all other points. This can be seen at the opposing sidewall 304 in the FIG. 2. As can be seen, the plate 106 contacts the upper surface of the opposing sidewall 304, since there is no communication cable 112 to exit the multichip package at the specific cross-sectional location depicted in the FIG. 2.

The disposal of the optoelectronic assembly 120 proximate to the side walls also permits easy connectability between the communication cable 112 and the optoelectronic assembly 120. In one exemplary embodiment, it is desirable for the optoelectronic assembly 120 to comprise an array of vertical cavity surface emitting lasers (VCSELS) and semiconductor laser diodes near one edge of the multichip package, prefixtured with a 12 fiber optical ribbon cable.

Figure 3A:
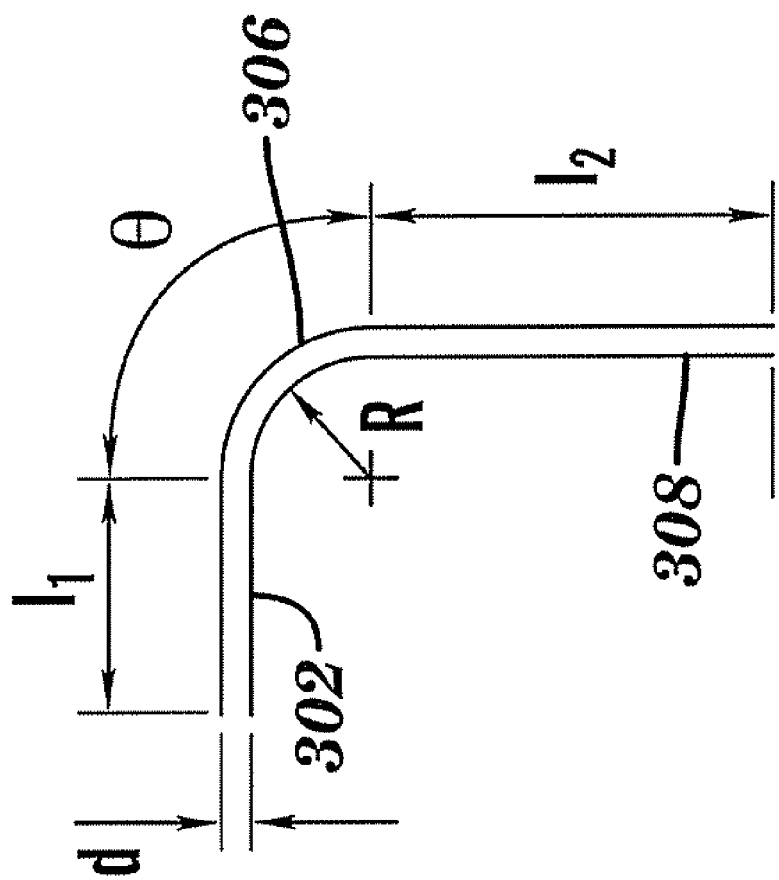
FIG. 3(a) is an exemplary view of a serpentine passage that comprises a single elbow.
Figure 3B:
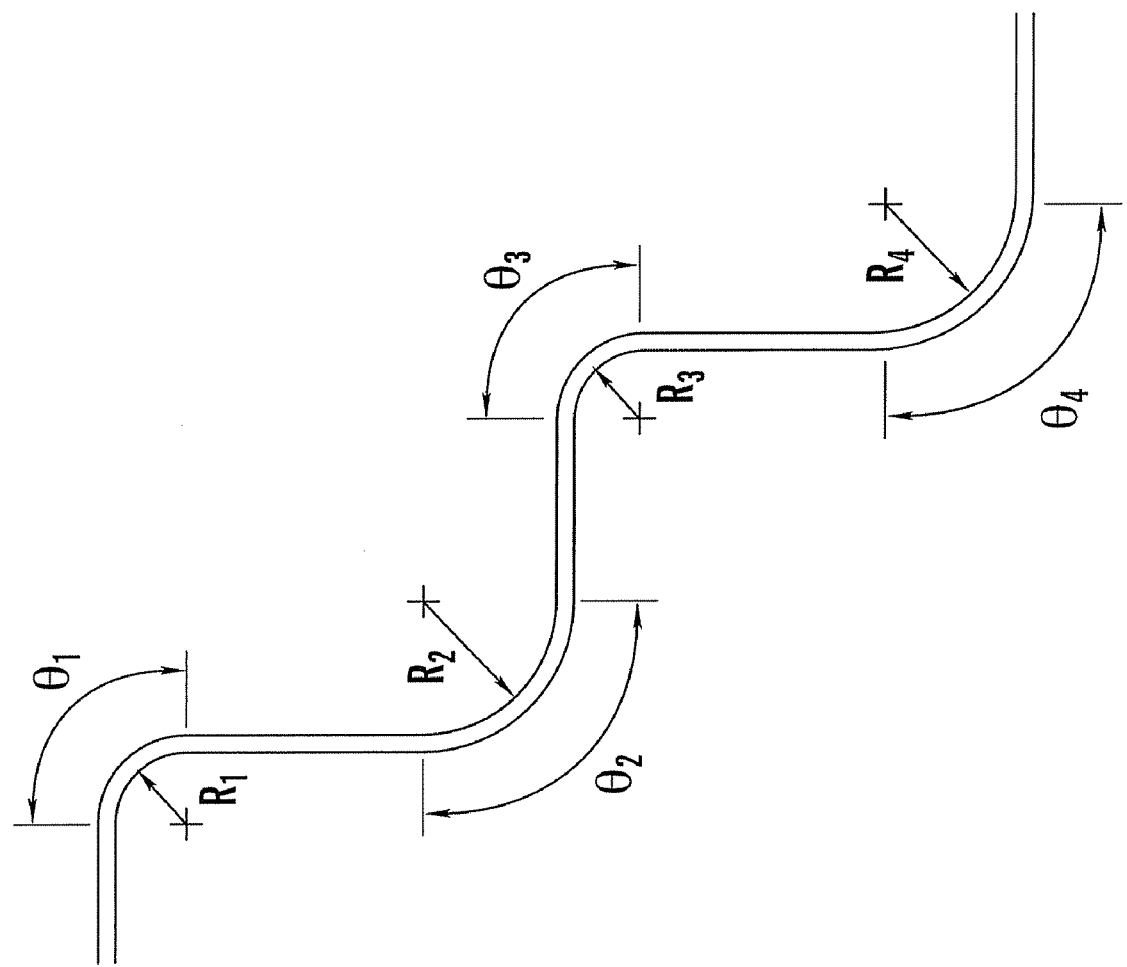
FIG. 3(b) is an exemplary view of a serpentine passage that comprises a plurality of elbows.

As can be seen in the FIGS. 2 and 3, the channel 124 has a shape that prevents the transfer of forces from outside the multichip package 100 to the optoelectronic assembly 120. In one exemplary embodiment, as shown in the FIG. 3 (a), the channel 124 created between the socket 200 and the plate 106 is an elbow. The elbow depicted in the FIG. 3(a) comprises two linear sections 302 and 308 represented by $l_1$ and $l_2$ respectively and at least one radial section 306 having an inner radius R that operates over an angle θ. The distance "d" represents the distance between the socket 200 and the plate 106.

The channel 124 may alternatively exist in the form a plurality of opposedly disposed elbows. In one embodiment, the opposedly disposed elbows may be sequentially arranged to form the channel 124 as depicted in the FIG. 3(b). In the FIG. 3(b), a first elbow having a radius $R_1$ operating over an angle $\theta_1$ is in communication with a second elbow having a radius $R_2$ operating over an angle $\theta_2$. The radii $R_1$ and $R_2$ are directionally opposed to each other. The second elbow is in communication with a third elbow having a radius $R_3$ operating over an angle $\theta_3$. The third elbow is in communication with a fourth elbow having a radius $R_4$ operating over an angle $\theta_4$. As can be seen from the FIG. 3(b), the radii $R_2$ and $R_3$ are directionally opposed to each other while the radii $R_3$ and $R_4$ are directionally opposed to each other.

In one embodiment, not depicted herein, the first elbow has its radii $R_1$ and $R_2$ directionally opposed to each other, while pairs of the remaining radii $R_2$ and $R_3$ or $R_3$ and $R_4$, and so on, are not exclusively directionally opposed to each other, but may be either parallel with each other or can intersect at angles of up to 90 degrees while being directionally disposed in substantially the same direction.

Figure 3C:
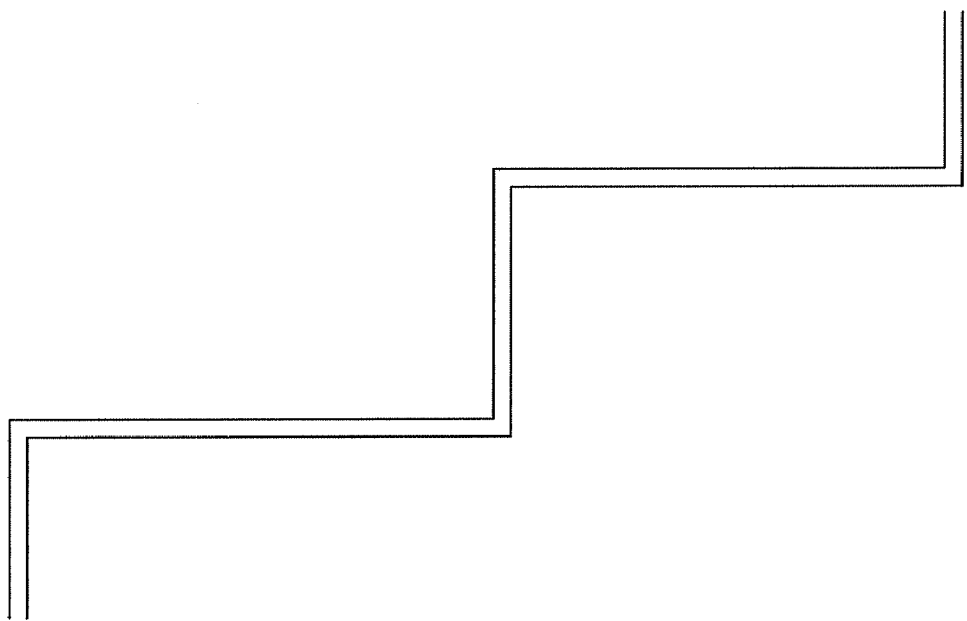
FIG. 3(c) is an exemplary view of a serpentine passage that comprises a plurality of elbows each of which do not have a radial section.

In another embodiment, when the respective elbows have no radius, the channel 124 has a shape similar to that shown in the FIG. 3(c), where each succeeding right angle in the elbow is disposed on an opposing side of a vertical section of the elbow from the preceding right angle in the elbow. In this embodiment, the channel 124 of FIG. 3(c) can be employed to house optical fibers that can transmit light at right angles to a given direction of light transmission.

The serpentine shape of the channel 124 shown in the FIGS. 3(a) and (b) provides strain relief to the communication cable 112. Any mechanical forces applied to the cable outside the multichip package 100 are not transmitted to the lasers, semiconductor laser diodes or to detectors inside the multichip package 100. It is to be noted that the serpentine channel 124 may be disposed within the four walls of the socket, outside the four walls of the socket, or within the four walls of the socket and outside the four walls of the socket, if desired.

In one embodiment, the channel 124 is sealed to prevent the ingress of moisture and contaminants into the multichip package. Sealing can be achieved by filling the channel 124 with a soft sealant that is compressed between the opposing surfaces of the plate 106 and the socket 200, (e.g., the first surface 105 of the plate 106 and the upper surface of the side walls 104, 204, 304 and 404). In one exemplary embodiment depicted in FIG. 4, a layer of sealant 404 and 406 can be adhesively bonded to each of the opposing surfaces of the plate 106 and the socket 200 respectively. In one manner of sealant operation, after the communication cable 112 is disposed in the channel 124, the opposing surfaces of the plate 106 and the socket 200 are brought together to form a fluid-tight seal with the communication cable 112 disposed in the sealant. The fluid-tight seal generally prevents air and moisture from contacting the optoelectronic assembly 120.

The sealant generally comprises an organic polymer. In one embodiment, it is optionally desirable for the sealant to have a dynamic elastic modulus below $10^6$ GigaPascals (GPa), at or below room temperature when measured at a frequency of 110 Hz using dynamic mechanical spectrometry. In another embodiment, it is optionally desirable for the sealant to have an elongation to break of greater than or equal to about 500 percent at room temperature when measured in a tensile test as per ASTM D 638.

Organic polymers used in the seal may be selected from a wide variety of thermoplastic polymers, blend of thermoplastic polymers, thermosetting polymers, or blends of thermoplastic polymers with thermosetting polymers. The organic polymer may also be a blend of polymers, copolymers, terpolymers, or combinations comprising at least one of the foregoing organic polymers. The organic polymer can also be an oligomer, a homopolymer, a copolymer, a block copolymer, an alternating block copolymer, a random polymer, a random copolymer, a random block copolymer, a graft copolymer, a star block copolymer, a dendrimer, or the like, or a combination comprising at least one of the foregoing organic polymers. It is generally desirable for the organic polymer used in the seal to comprise an elastomer that has a glass transition temperature below room temperature.

Examples of the organic polymers are polyolefins, polyacrylics, polyvinyl ethers, polyvinyl thioethers, polyvinyl halides, polyvinyl nitrites, polyvinyl esters, polyurethanes, styrene acrylonitrile, acrylonitrile-butadiene-styrene (ABS), ethylene propylene diene rubber (EPR), polyisoprene, polybutadiene, styrene-butadiene diblock and triblock copolymers, nitrile rubbers, urethane elastomers, fluorinated ethylene propylene, perfluoroalkoxyethylene, or the like, or a combination comprising at least one of the foregoing organic polymers.

Examples of thermosetting polymers suitable for use in the seal include epoxy polymers, unsaturated polyester polymers, polysiloxane polymers, polyimide polymers, bismaleimide polymers, bismaleimide triazine polymers, cyanate ester polymers, vinyl polymers, benzoxazine polymers, benzocyclobutene polymers, acrylics, alkyds, phenolformaldehyde polymers, novolacs, resoles, melamine-formaldehyde polymers, ureaformaldehyde polymers, hydroxymethylfurans, isocyanates, diallyl phthalate, triallyl cyanurate, triallyl isocyanurate, unsaturated polyesteramides, or the like, or a combination comprising at least one of the foregoing thermosetting polymers.

Examples of blends of thermoplastic polymers include acrylonitrile-butadiene-styrene/nylon, polycarbonate/acrylonitrile-butadiene-styrene, acrylonitrile butadiene styrene/polyvinyl chloride, polysulfone/acrylonitrile-butadiene-styrene, polycarbonate/polyurethane, or the like.

Exemplary sealants are elastomeric polysiloxane polymers. An exemplary commercially available polysiloxane polymer is SYLGARD®, manufactured by Dow Corning Company. Another exemplary commercially available polysiloxane copolymer is GE3280®, manufactured by Momentive Performance Materials.

Figure 5:
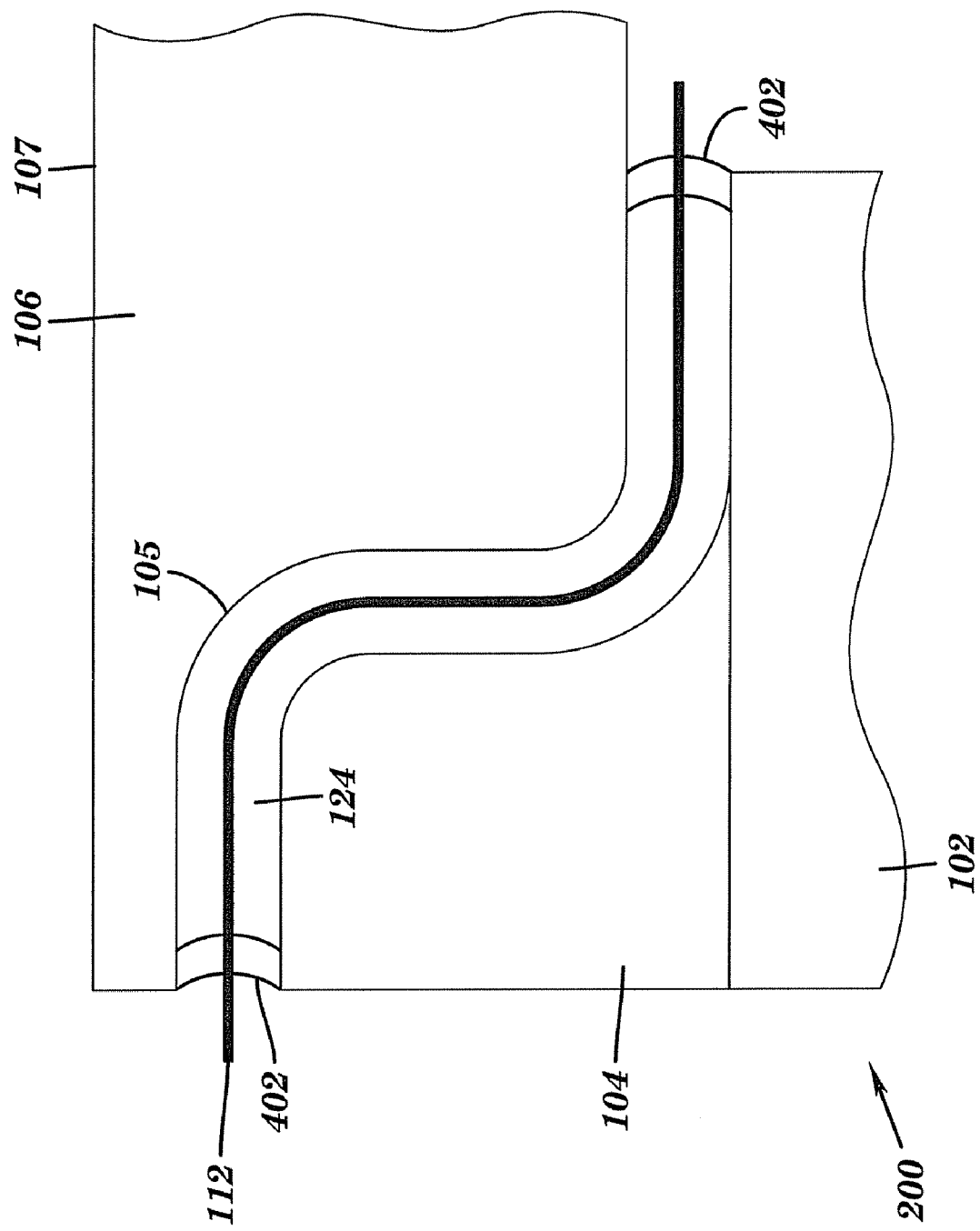
FIG. 5 is an exemplary view of another manner of sealing the channel; the channel is sealed using an organic polymeric sealant.

In another embodiment, the seal can comprise a single elastomeric flap 402 or a plurality of elastomeric flaps 402 that are disposed on the opposing surfaces of the plate 106 and the socket 200 as shown in the FIG. 5. As shown in the FIG. 5, the communication cable 112 contacts the elastomeric flaps 320 to form a seal, when the plate 106 contacts the socket 200. If the communication cable 112 comprises a fiber optical ribbon cable, the once it exits the multichip package 100, an industry standard multifiber connector such as a multi-fiber push on (MPO) connector may be used to connect the fiber optical ribbon cable to an external device.

As noted above, a heat exchanger 502 is disposed upon the second surface 107 of the plate 106. In one embodiment, the heat exchanger 502 is a heat sink that extracts heat from the plate 106 and discharges it to a cooling fluid. The cooling fluid can be gaseous or a liquid. The cooling fluid can be air; water; nitrogen; helium; a mixture of dry ice and a volatile organic solvent such as alcohols and/or ketones; refrigerants such as chlorofluorocarbons; dielectric coolants such as mineral oil or castor oil; liquid metal coolants such as an alloy of sodium and potassium, mercury; brine; or the like. The heat exchanger 502 can therefore be air-cooled or liquid-cooled. In an exemplary embodiment, the heat exchanger 502 is water-cooled.

Figure 6:
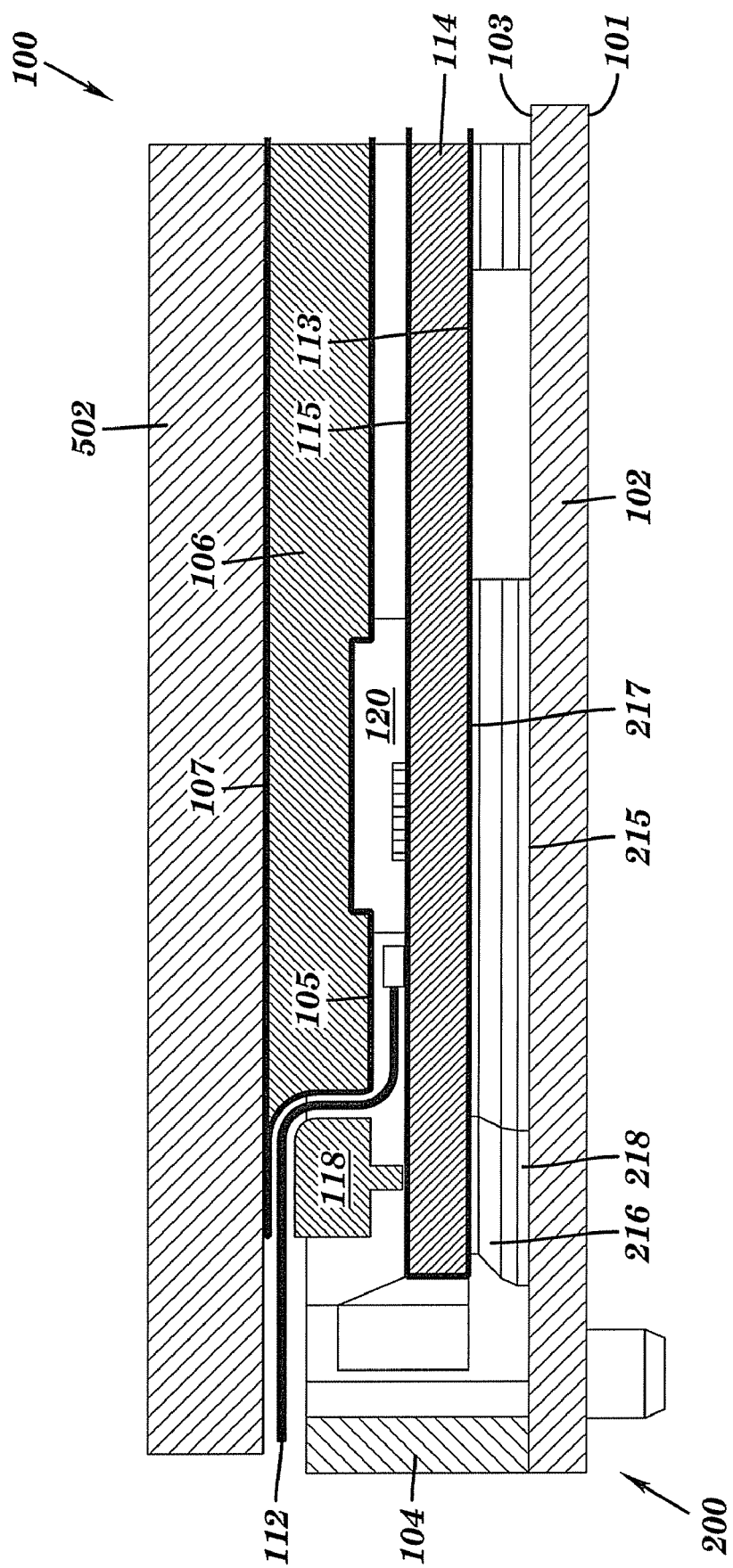
FIG. 6 is another exemplary cross-sectional view of the multichip package.

In one embodiment, in one manner of proceeding, a multichip package 100 depicted in FIG. 6 can comprise a plate 106 having a first surface 105 and a second surface 107 disposed on a socket 200. Disposed within the socket 200 is a first substrate 114 and a second substrate 216. The second substrate 216 comprises a first surface 215 and a second surface 217. As will be detailed, the second substrate 216 can be used to provide electrical communications to the optoelectronics assembly 120. In this embodiment, the socket 200 comprises a base plate 102 that is integral with vertical walls 104, 204, 304 and 404. The base plate 102 together with vertical walls 104, 204, 304 and 404 function as an electrical socket for supplying electrical energy to the components disposed on the first and second substrates. It is to be noted that the other vertical walls 204, 304 and 404 are not shown in this depiction.

The socket is in signal communication with a first surface 215 of the second substrate 216 via a suitable electrical connection 218 (such as column or ball-grid-array connections, ceramic-ball-grid-array (CBGA) or land grid array (LGA), for example), for providing power and communicating signals to and from the first substrate 114 and to other components of the multichip package. This electrical connection could also include a pluggable high-speed electrical connector. The electrical communication between the socket and the first substrate 114 can provide electricity for the functioning of the optoelectronic assembly 120 as well as electrical signal communication among the optoelectronics, microprocessors, memory chips, or the like, resident within the MCM as well as signal communication and power supplied by the server to the MCM. The optoelectronic assembly 120 is disposed on the second surface 115 of the first substrate 114.

The first surface 105 of the plate 106 is disposed upon and in contact with the vertical wall 104 at all points along the upper surface of the vertical wall 104 except for those portions where the communication cable exits the multichip package 100. A sealant such as SYLGARD® is disposed at all points along the upper surface of the vertical wall 104 that contact the first surface 105. As can be seen in the FIG. 6, an insert 118 is disposed adjacent to those portions where the communication cable 112 emerges from the multichip package. Since the plate 106 and the vertical walls 104, 204, 304 and 404 do not contact each other at locations where the communication cable 112 emerges from the multichip package, an insert 118 is used to fill the gap, thereby minimizing the entry of contaminants into the multichip package.

In one embodiment, the communication cable 112 can be a ribbon fiber optic cable that is disposed in the channel 124 created between the insert 118 and the plate 106. The channel 124 has a serpentine shape and may have a sealant disposed therein to prevent the ingress of contaminants into the multichip package.

Disposed upon and in communication with the second surface 107 of the plate 106 is the heat exchanger 502. As noted above, the heat exchanger may be air cooled or liquid cooled. The heat exchanger 502 is preferably water cooled. In an exemplary embodiment, the plate 106 is a heat exchanger facilitates heat transfer from solid to fluid. In this embodiment, the plate 106 has extended surfaces (not shown) that contact a fluid to promote a convective heat transfer between the solid and the fluid.

The contact points between the plate 106 and the heat exchanger 502 are coated with a grease to provide improved thermal contact between the two surfaces. This increased thermal contact facilitates heat dissipation from the multichip package 100 to the heat exchanger 502.

The multichip package 100 disclosed above in the FIGS. 2 through 6 is advantageous in that the communication cable is routed through a channel disposed in the edge of the socket such that it emerges from the edge of the multichip package without comprising the integrity of the seal or the edge of the multichip package. The communication cable also does not interfere with the heat exchangers. The serpentine design of the channel provides strain relief to the communication cables when they comprise fiber optical ribbon cable. This is uniquely important to fiber optic cable assemblies, which suffer increased attenuation and possible mechanical failure if exposed to high bend radius or strain levels. In addition, other currently existing commercially available heat sinks may be used in conjunction with the multichip package without any redesign of the multichip package. This lowers design and manufacturing costs.

While embodiments described herein depict the interconnection of a processor complex within a multi-chip module (MCM) to other processor complexes having an exemplary optoelectronic signal path, it will be appreciated that the disclosed invention is also applicable to the interconnection of other electronic devices housed in MCMs or SCMs (single chip module), or other types of first level packaging. For example, embodiments of the invention may be employed for interconnecting the core switches within a large-scale internet switch, or router, with the network processors in the router's line cards. Similarly, other electronic systems requiring dense interconnection of electronic chips mounted on MCMs or SCMs or other types of first level packaging at a high aggregate bandwidth over distances of 0.2 meters (m) or greater may benefit from embodiments of the invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A multichip package comprising:
    an optoelectronics assembly;
    a socket that houses the optoelectronics assembly; the socket being in electrical communication with the optoelectronics assembly;
    a plate having a first surface and a second surface; the first surface being opposedly disposed to the second surface; a portion of the first surface contacting a portion of the socket to provide thermal contact between the socket and the plate;
    a serpentine channel being disposed between the plate and the socket to provide a passage for a communication cable that is in operative communication with the optoelectronics assembly; and a heat exchanger in thermal contact with the plate; the heat exchanger being operative to cool the multichip package.

2. The multichip package of claim 1, wherein the optoelectronics assembly is disposed proximate to a vertical wall of the socket.

3. The multichip package of claim 1, wherein the socket further comprises an insert; the insert being disposed proximate to a location where the communication cable exits the multichip package.

4. The multichip package of claim 3, wherein the serpentine channel is disposed between the plate and the socket to provide a passage for a communication cable that is in operative communication with the optoelectronics assembly.

5. The multichip package of claim 1, wherein the serpentine channel comprises at least one elbow; the elbow having a first linear section and a second linear section; the first linear section and the second linear section being in communication with one another via a radial section.

6. The multichip package of claim 1, wherein the serpentine channel comprises a plurality of elbows; at least one elbow having two linear sections separated by a radial section; the linear sections being in communication with the radial section.

7. The multichip package of claim 1, wherein the serpentine channel comprises a plurality of elbows; each elbow having two linear sections separated by a radial section; the linear sections being in communication with the radial section.

8. The multichip package of claim 1, wherein the serpentine channel is operative to control the external forces that are transmitted to the optoelectronics assembly.

9. The multichip package of claim 1, wherein the serpentine channel comprises a seal that is effective to control the ingress of contaminants into the multichip package.

10. The multichip package of claim 1, wherein a wall of the serpentine channel is coated with a sealant that contacts the communication cable.

11. The multichip package of claim 1, wherein the portion of the first surface contacts the portion of the socket via a vertical wall.

12. The multichip package of claim 1, wherein the heat exchanger is a liquid cooled heat exchanger.

13. The multichip package of claim 12, wherein the optoelectronics assembly comprises a vertical cavity surface emitting laser.

14. The multichip package of claim 1, wherein the multichip package further comprises an optoelectronic transceiver, a fiber output, microprocessor, or a memory chip.

15. The multichip package of claim 12, wherein the optoelectronics assembly comprises a data processing chip, a data switching chip, a data storage chip, an electronic chip set that is configured for providing multiplexing, demultiplexing, coding or decoding, an optoelectronic element comprising laser diodes or photodetectors for driving and/or receiving functions, or a combination comprising at least one of the foregoing chips, chip sets or optoelectronic elements.

16. A method comprising:
  disposing an optoelectronics assembly in a socket; the socket comprising a base plate, a wall, and an insert;
  disposing a plate on the socket; the disposing being effective to create a channel between the plate and the insert;
  disposing a communication cable in the channel; the communication cable contacting the optoelectronics assembly; and
  disposing a heat exchanger on a surface of the plate; the surface of the plate that contacts the heat exchanger being opposed to the surface that faces the optoelectronic assembly.

17. The method of claim 16, wherein the optoelectronics assembly is disposed at locations proximate to the vertical wall of the socket.

18. An article manufactured by the method of claim 16.

\* \* \* \* \*